(12) United States Patent
Paul et al.

(10) Patent No.: US 12,000,868 B2
(45) Date of Patent: Jun. 4, 2024

(54) WAVEFORM SEGMENTATION DEVICE AND WAVEFORM SEGMENTATION METHOD

(71) Applicants: KABUSHIKI KAISHA TOSHIBA, Minato-ku (JP); Kioxia Corporation, Minato-ku (JP)

(72) Inventors: Topon Paul, Kawasaki (JP); Takeichiro Nishikawa, Yokohama (JP)

(73) Assignees: KABUSHIKI KAISHA TOSHIBA, Minato-ku (JP); Kioxia Corporation, Minato-ku (JP)

( * ) Notice: Subject to any disclaimer, the term of this patent is extended or adjusted under 35 U.S.C. 154(b) by 559 days.

(21) Appl. No.: 16/818,482

(22) Filed: Mar. 13, 2020

(65) Prior Publication Data

US 2020/0379016 A1 Dec. 3, 2020

(30) Foreign Application Priority Data

May 27, 2019 (JP) .................................. 2019-098815

(51) Int. Cl.
*G01R 13/34* (2006.01)
*G01R 19/25* (2006.01)

(52) U.S. Cl.
CPC ........ *G01R 13/345* (2013.01); *G01R 19/2509* (2013.01)

(58) Field of Classification Search
CPC .................. G01R 13/345; G01R 19/2509
See application file for complete search history.

(56) References Cited

U.S. PATENT DOCUMENTS

| | | | |
|---|---|---|---|
| 7,437,624 B2 | 10/2008 | Miller et al. | |
| 2002/0116135 A1* | 8/2002 | Pasika | G16B 20/20 702/19 |
| 2008/0270071 A1* | 10/2008 | Marvasti | G06K 9/00536 702/179 |
| 2009/0236501 A1* | 9/2009 | Takahashi | G01J 1/44 250/214 R |
| 2010/0049522 A1* | 2/2010 | Tamura | G10L 13/033 704/E13.007 |
| 2011/0213577 A1* | 9/2011 | Mousavi | G01R 19/2509 702/66 |
| 2016/0335875 A1* | 11/2016 | Alcorn | G01F 1/34 |
| 2018/0011067 A1* | 1/2018 | Kozawa | G01N 30/8641 |

FOREIGN PATENT DOCUMENTS

| | | |
|---|---|---|
| CN | 1975710 A | 6/2007 |
| CN | 107209157 A | 9/2017 |
| JP | 3669312 B2 | 7/2005 |
| JP | 2006-501476 A | 1/2006 |
| JP | 2011-106827 A | 6/2011 |
| JP | 5176534 B2 | 4/2013 |
| WO | WO 2016/120959 A1 | 8/2016 |

* cited by examiner

*Primary Examiner* — Michael J Dalbo
(74) *Attorney, Agent, or Firm* — Oblon, McClelland, Maier & Neustadt, L.L.P.

(57) ABSTRACT

A waveform segmentation device has a state level estimation unit that estimates a state level of input waveform data, and a segmentation identification unit that segments the waveform data at a plurality of segmentation points based on the state level estimated by the state level estimation unit. The segmentation identification unit may identify the plurality of segmentation points such that a feature value of the waveform data is included between two adjacent segmentation points among the segmentation points.

18 Claims, 12 Drawing Sheets

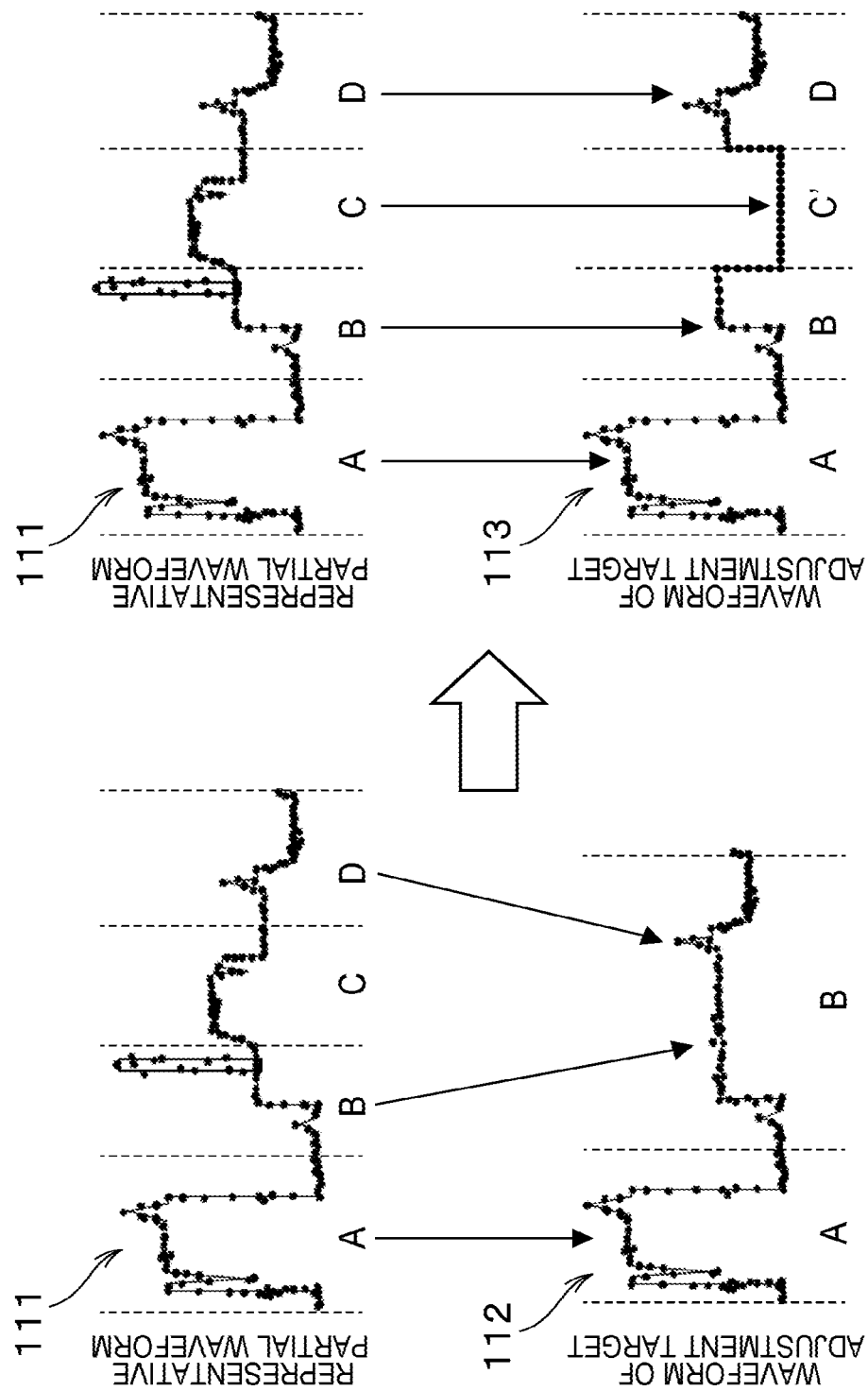

| SEGMENTATION POINT CANDIDATE | CLASSIFICATION ACCURACY |
|---|---|
| 10% | 0.70 |
| 20% | 0.60 |
| 30% | 0.75 |
| 40% | 0.78 |
| 50% | 0.90 |
| 60% | 0.74 |
| 70% | 0.71 |
| 80% | 0.68 |
| 90% | 0.65 |
| 100% | 0.60 |

FIG.11

WAVEFORM SEGMENTATION DEVICE AND WAVEFORM SEGMENTATION METHOD

CROSS REFERENCE TO RELATED APPLICATIONS

This application is based upon and claims the benefit of priority from the prior Japanese Patent Application No. 2019-98815, filed on May 27, 2019, the entire contents of which are incorporated herein by reference.

FIELD

Embodiments described herein relate generally to a waveform segmentation device and a waveform segmentation method.

BACKGROUND

Production factories and plants are equipped with a large number of sensors in order for failure prediction, failure classification, abnormality detection, and the like. A large amount of detection data output in a time-series manner from these sensors is analog waveform data, and is generally subjected to A/D conversion and stored in a storage device, and then, a waveform feature value is extracted to perform abnormality detection and the like.

However, the waveform data of each of the sensors has a complicated waveform due to spike-like noise and irregular fluctuations of an amplitude level. Thus, it is not easy to extract a valid feature value from the waveform of the detection data.

There is a method of automatically segmenting a waveform of detection data into a plurality of partial waveforms and extracting a feature value from each of the partial waveforms. At this time, it is conceivable to perform waveform shaping to remove noise components included in each of the partial waveforms and then compare the waveform with a normal waveform. However, if the waveform shaping of each of the partial waveforms is performed, a difference from the normal waveform decreases, and there is a risk that it is difficult to correctly perform abnormality detection.

Further, there is even a risk that a feature value is erroneously divided into different partial waveforms when automatically segmenting the waveform data into a plurality of partial waveforms. In this case, it becomes difficult to extract the feature value from the partial waveform.

BRIEF DESCRIPTION OF THE DRAWINGS

FIG. 8A is a view illustrating a processing operation of a second segmentation adjustment unit according to a second embodiment;

FIG. 11 is a view illustrating an example of an output value of an abnormality detection model when a segmentation point is shifted in units of 10%.

DETAILED DESCRIPTION

According to one embodiment, a waveform segmentation device has a state level estimation unit that estimates a state level of input waveform data, and a segmentation identification unit that segments the waveform data at a plurality of segmentation points based on the state level estimated by the state level estimation unit.

Hereinafter, embodiments of a waveform segmentation device will be described with reference to the drawings. Hereinafter, a description will be given focusing on the main components of the waveform segmentation device, but the waveform segmentation device may have components and functions that are not illustrated or described. The following description does not exclude the components and functions that are not illustrated or described.

First Embodiment

Figure 1:
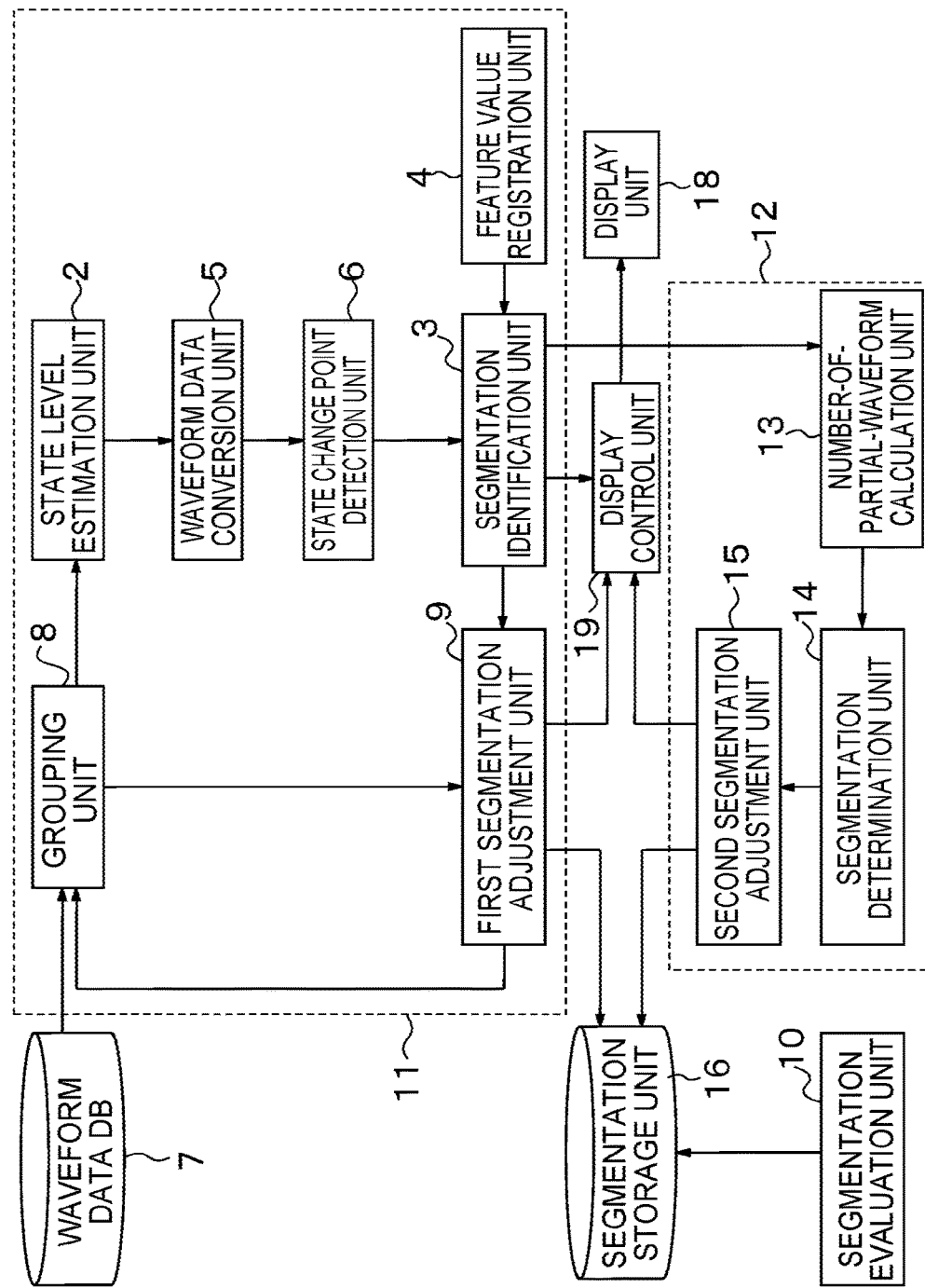
FIG. 1 is a block diagram illustrating a schematic configuration of a waveform segmentation device 1 according to a first embodiment.

FIG. 1 is a block diagram illustrating a schematic configuration of a waveform segmentation device 1 according to a first embodiment. The waveform segmentation device 1 of FIG. 1 performs a process of extracting input waveform data. More specifically, the waveform segmentation device 1 of FIG. 1 extracts a feature value of the input waveform data. The feature value is, for example, a characteristic shape of a waveform. The waveform data input to the waveform segmentation device 1 in FIG. 1 is detection data of various sensors installed in, for example, a production factory, a plant, or the like. Note that there is no limit on a type of the sensor. Further, the waveform segmentation device 1 of FIG. 1 can be used for the purpose of extracting feature values of various types of waveform data other than the detection data of the sensor.

The waveform segmentation device 1 of FIG. 1 includes a state level estimation unit 2 and a segmentation identification unit 3 as a minimum necessary configuration.

The state level estimation unit 2 estimates a state level of input waveform data. The state level is, for example, a level corresponding to a value (for example, an amplitude value) of the waveform data. The state level estimation unit 2 estimates which state level the input waveform data belongs to.

The segmentation identification unit 3 segments waveform data at a plurality of segmentation points based on the state level estimated by the state level estimation unit 2. In the present embodiment, a waveform between two adjacent segmentation points is called a partial waveform. The partial waveform includes at least one feature value. In this manner, the segmentation identification unit 3 identifies the plurality of segmentation points in a time-axis direction using the feature value included in the waveform data as a break.

The segmentation identification unit 3 may grasp a feature value included in waveform data based on a feature value registered in a feature value registration unit 4. Examples of the feature value registered in the feature value registration unit 4 include a state level, an amplitude, state transition, undershoot, overshoot, and a spike of a waveform. Note that a specific type of the feature value of the waveform is arbitrary.

The waveform segmentation device 1 of FIG. 1 may include a waveform data conversion unit 5 and a state change point detection unit 6. The waveform data conversion unit 5 converts waveform data based on a state level estimated by the state level estimation unit 2. For example, the waveform data conversion unit 5 may perform conversion to remove undershoot, overshoot, a spike, and the like included in the waveform data. The state change point detection unit 6 detects a state change point at which the state level of the waveform data converted by the waveform data conversion unit 5 changes. The segmentation identification unit 3 may identify a segmentation point based on the state change point.

The waveform segmentation device 1 of FIG. 1 may include a waveform data database (hereinafter, waveform data DB) 7. The waveform data DB 7 stores waveform data such as detection data of various sensors in chronological order. Further, the waveform data DB 7 may store waveform data determined as a normal waveform or an abnormal waveform by the waveform segmentation device 1 in FIG. 1 as well as the waveform data such as the sensor detection data. The waveform data DB 7 may be divided into a plurality of DBs. For example, the waveform data may be stored in a different DB for each sensor. Further, link destination information of the waveform data may be stored in the waveform data DB 7. In this case, the waveform data is read from a link destination based on the link destination information read from the waveform data DB 7.

The waveform segmentation device 1 of FIG. 1 may include a grouping unit 8. The grouping unit 8 segments waveform data into a plurality of groups based on a value of the waveform data. The grouping unit 8 may use the input waveform data as it is and segment the waveform data into a plurality of groups, or may convert the input waveform data by the waveform data conversion unit 5 and then segment the converted waveform data into a plurality of groups. The waveform data from the sensor or the like may be directly input to the grouping unit 8, or the waveform data read from the waveform data DB 7 may be input to the grouping unit 8.

The waveform segmentation device 1 of FIG. 1 may include a first segmentation adjustment unit 9. The first segmentation adjustment unit 9 adjusts a segmentation point for single waveform data. More specifically, the first segmentation adjustment unit 9 estimates state levels of a plurality of pieces of partial waveform data based on the plurality of pieces of partial waveform data obtained by segmenting waveform data at a plurality of segmentation points, updates state levels estimated by the state level estimation unit 2 based on the estimated state levels, and adjusts positions of the plurality of segmentation points. In this manner, the first segmentation adjustment unit 9 checks whether a segmentation point identified by the segmentation identification unit 3 is appropriate, and adjusts the segmentation point if not.

The waveform segmentation device 1 of FIG. 1 may include a segmentation evaluation unit 10. The segmentation evaluation unit 10 evaluates whether a plurality of segmentation points identified by the segmentation identification unit 3 or segmentation points adjusted by the first segmentation adjustment unit 9 are appropriate. The segmentation evaluation unit 10 may perform the above-described evaluation using a visualization unit that visualizes a result obtained by segmenting waveform data at a plurality of segmentation points as will be described later. The visualization unit visualizes, for example, representative waveform data and a plurality of representative segmentation points and adjustment target waveform data and a plurality of segmentation points thereof. More specifically, the visualization unit includes a display control unit 19 that causes a display unit 18 to display the representative waveform data and the plurality of representative segmentation points and the adjustment target waveform data and the plurality of segmentation points thereof. The segmentation evaluation unit 10 may evaluate a plurality of segmentation points visualized by the visualization unit. Alternatively, the segmentation evaluation unit 10 may perform the above-described evaluation using determination accuracy output from an abnormality detection model. Here, the representative waveform data is representative waveform data selected from among a plurality of pieces of waveform data belonging to a waveform group. The representative waveform data may be newly generated using a plurality of pieces of waveform data belonging to a waveform group.

The grouping unit 8, the state level estimation unit 2, the segmentation identification unit 3, and the first segmentation adjustment unit 9 in the waveform segmentation device 1 of FIG. 1 perform segmentation of single waveform data, and are referred to as a single waveform segmentation unit 11 in the present embodiment.

Meanwhile, the waveform segmentation device 1 of FIG. 1 may include a waveform group segmentation unit 12 that performs segmentation of a waveform group. The waveform group segmentation unit 12 includes a number-of-partial-waveform calculation unit 13, a segmentation determination unit 14, and a second segmentation adjustment unit 15.

The number-of-partial-waveform calculation unit 13 calculates the number of partial waveforms required to segment each waveform data included in a waveform group. The number of partial waveforms may be a number calculated based on the number of partial waveforms of each waveform data included in the waveform group or may be a number set by a user in advance. When calculating the required number of partial waveforms based on the number of partial waveforms of each waveform data included in the waveform group, for example, a frequency of the number of partial waveforms in the waveform group is calculated, and the number of partial waveforms having the highest frequency is determined as the required number of partial waveforms.

The segmentation determination unit 14 determines representative waveform data and representative segmentation points using segmentation points of the entire waveform data included in a waveform group. A clustering technique can be used to determine the representative segmentation points. In this case, each waveform data included in the waveform group is segmented into n groups, one of the pieces of waveform data is set as representative waveform data, and representative segmentation points are set based on grouping of the representative waveform data.

The second segmentation adjustment unit 15 adjusts a plurality of segmentation points for segmentation of input waveform data based on a plurality of representative segmentation points for segmentation of representative waveform data. In this manner, the second segmentation adjustment unit 15 adjusts the segmentation points of each waveform data of the waveform group based on the plurality of representative segmentation points.

More specifically, the second segmentation adjustment unit 15 adjusts the plurality of segmentation points by pattern-matching the plurality of pieces of representative partial waveform data obtained by segmenting the representative waveform data at the plurality of representative segmentation points with the plurality of pieces of partial waveform data obtained by segmenting each of the plurality of pieces of input waveform data at the plurality of segmentation points. When at least one of the plurality of pieces of input waveform data has a different waveform length from another waveform data, the segmentation determination unit 14 may determine the representative waveform data and the plurality of representative segmentation points after performing a process of aligning time lengths of the plurality of pieces of waveform data.

The second segmentation adjustment unit 15 may delete a segmentation point at a position distant from the plurality of representative segmentation points while leaving a segmentation point at a position close to the plurality of representative segmentation point among the plurality of segmentation points for each of the plurality of pieces of input waveform data.

The waveform segmentation device 1 of FIG. 1 may include a segmentation storage unit 16. The segmentation storage unit 16 stores segmentation data. The segmentation data stores a state level of waveform data, the number of partial waveforms when the waveform data is segmented at a plurality of segmentation points, a start point and an end point of each partial waveform, a feature value included in each partial waveform, and the like. A length of the partial waveform may be stored instead of the start point and the end point of each partial waveform.

Figure 2:
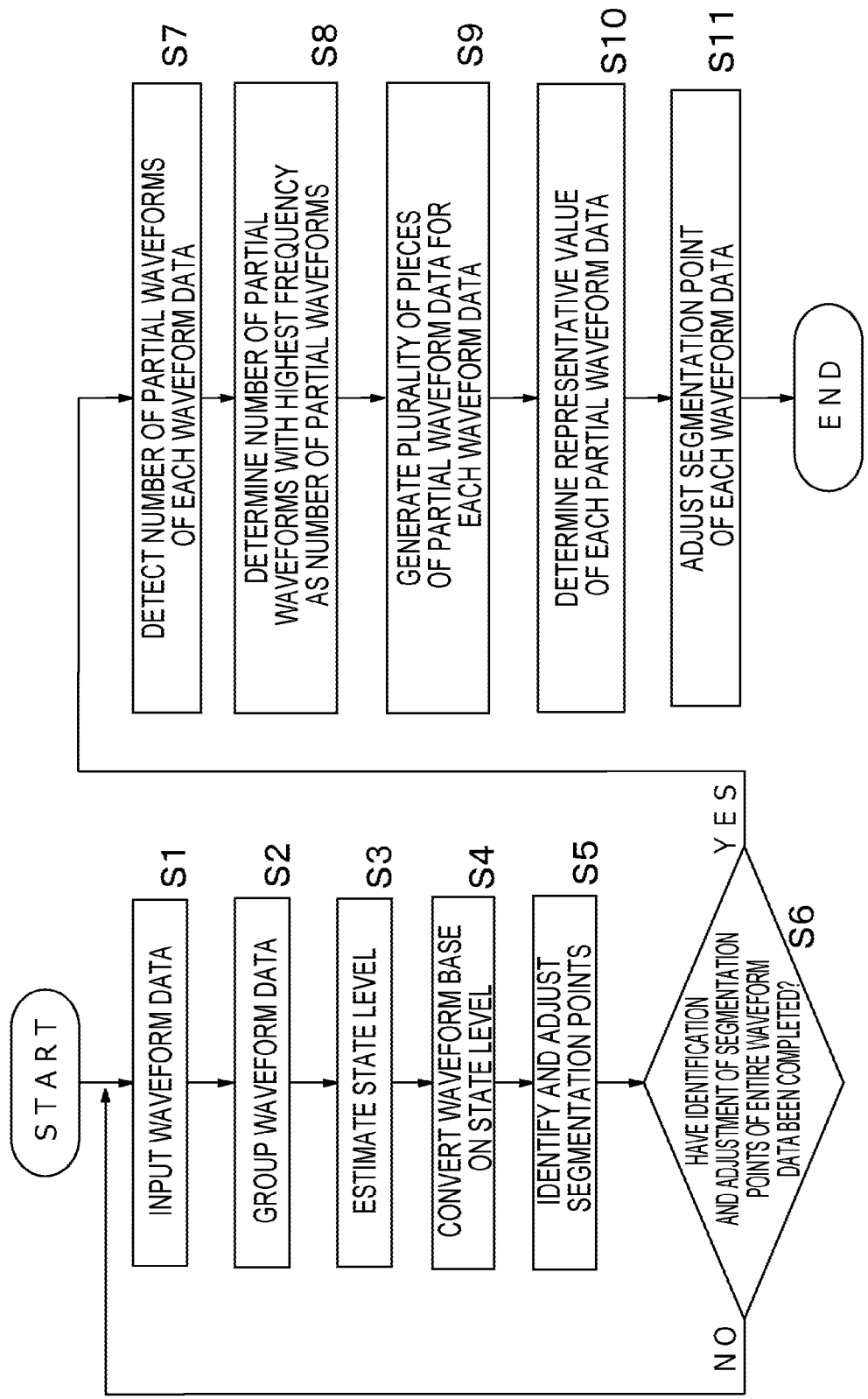
FIG. 2 is a flowchart illustrating an example of a processing operation of the waveform segmentation device of FIG. 1.

FIG. 2 is a flowchart illustrating an example of a processing operation of the waveform segmentation device 1 of FIG. 1. Steps S1 to S6 in FIG. 2 illustrate a processing operation of the single waveform segmentation unit 11, and Steps S7 to S11 illustrate a processing operation of the waveform group segmentation unit 12. In this manner, a process of segmenting waveform group including a plurality of pieces of waveform data is performed after identification of segmentation points of each input waveform data is completed.

First, the grouping unit 8 receives input of waveform data from the waveform data DB 7 (Step S1). As described above, the grouping unit 8 may directly acquire waveform data output from the sensor and the like. The grouping unit 8 segments the input waveform data into a plurality of groups (Step S2).

Next, the state level estimation unit 2 integrates or divides some groups of the plurality of groups segmented by the grouping unit 8 to update the grouping, and estimates a representative value of each updated group as a state level (Step S3). If there is only one state level, the processing of FIG. 2 may be ended in Step S3.

Next, the waveform data conversion unit 5 converts the waveform data using the state level estimated in Step S3 (Step S4). Next, the state change point detection unit 6 detects a state change point based on the converted waveform data. The segmentation identification unit 3 sets the detected state change point as a segmentation point candidate, and identifies segmentation points such that a partial waveform between two adjacent segmentation points includes one or more feature values (Step S5). Further, the adjustment of the segmentation points by the first segmentation adjustment unit 9 is also performed in this Step S5.

Next, it is determined whether the identification and the adjustment of the segmentation points of the entire target waveform data in the waveform data DB 7 have been completed (Step S6). If there is any waveform data for which the identification and adjustment of the segmentation points have not been completed, the processing after Step S1 is repeated.

When the identification and adjustment of the segmentation points of the entire waveform data have been completed, the segmentation process of the waveform group is started. First, the number-of-partial-waveform calculation unit 13 detects the number of partial waveforms of each waveform data in the waveform group (Step S7) in order to determine the number of partial waveforms of the waveform group including the plurality of pieces of waveform data segmented in Steps S1 to S6, and determines the number of partial waveforms having the highest frequency as the number of partial waveforms of each waveform data (Step S8).

Next, each waveform data included in the waveform group is segmented at a plurality of segmentation points so as to obtain the number of partial waveforms determined in Step S8, thereby generating a plurality of pieces of partial waveform data (Step S9). Next, a representative value of each partial waveform data in each waveform data is determined for each waveform data (Step S10). Next, the segmentation point of each waveform data is adjusted based on the representative value of each partial waveform data (Step S11).

Figure 3:
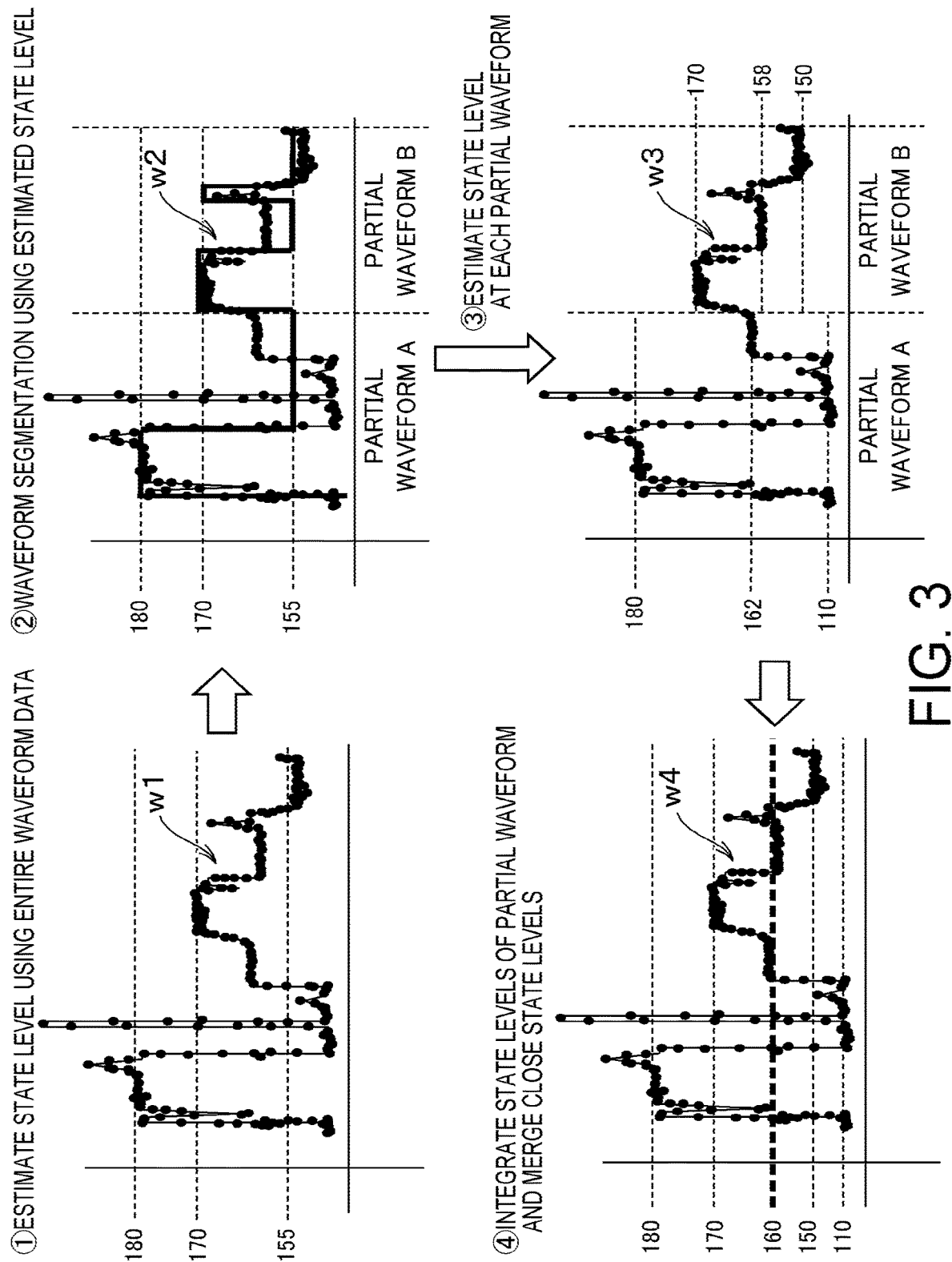
FIG. 3 is a view for describing a processing operation of a single waveform segmentation unit in Steps S1 to S6 in FIG. 2.
Figure 4:
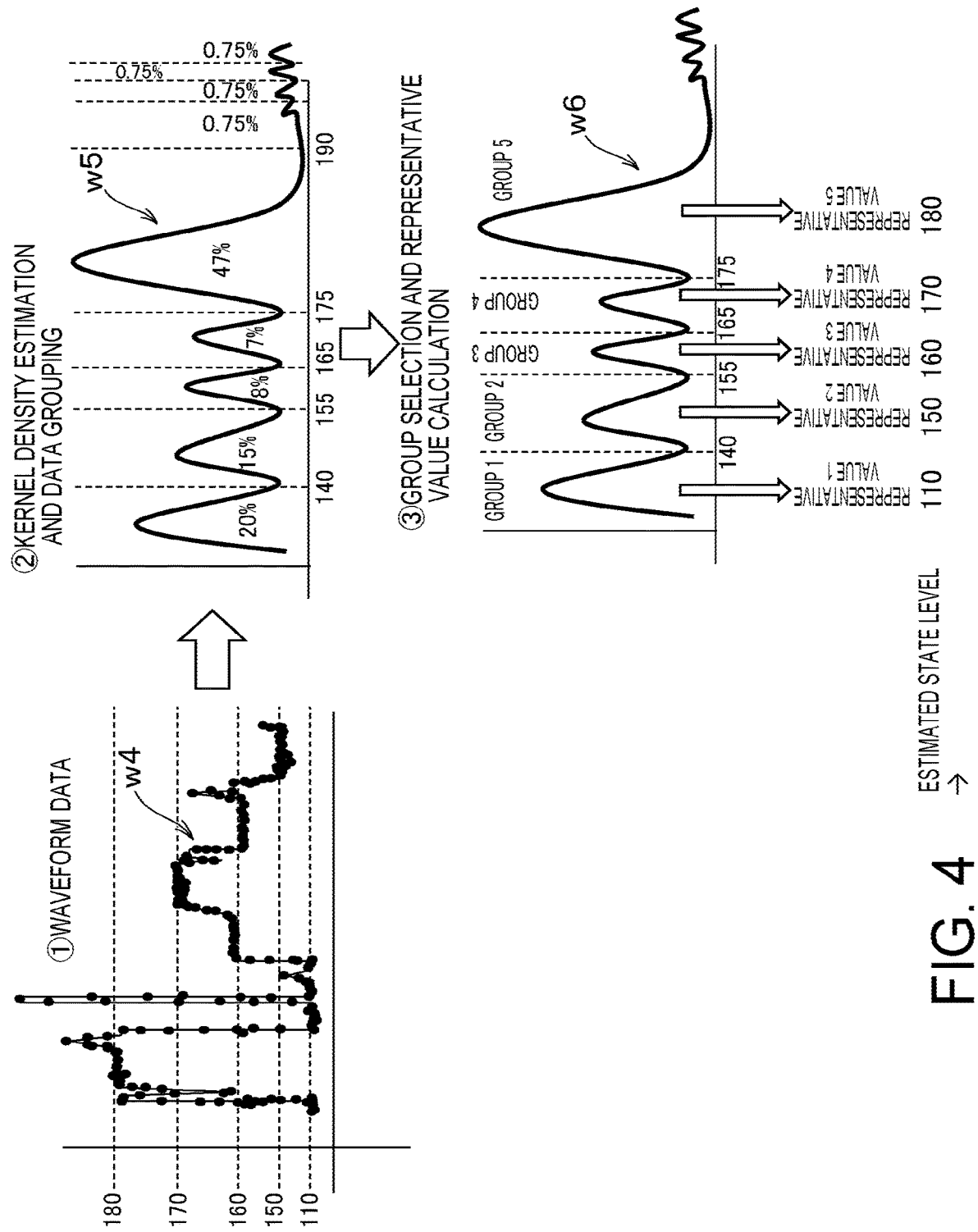
FIG. 4 is a view for describing a processing operation subsequent to FIG. 3.
Figure 5:
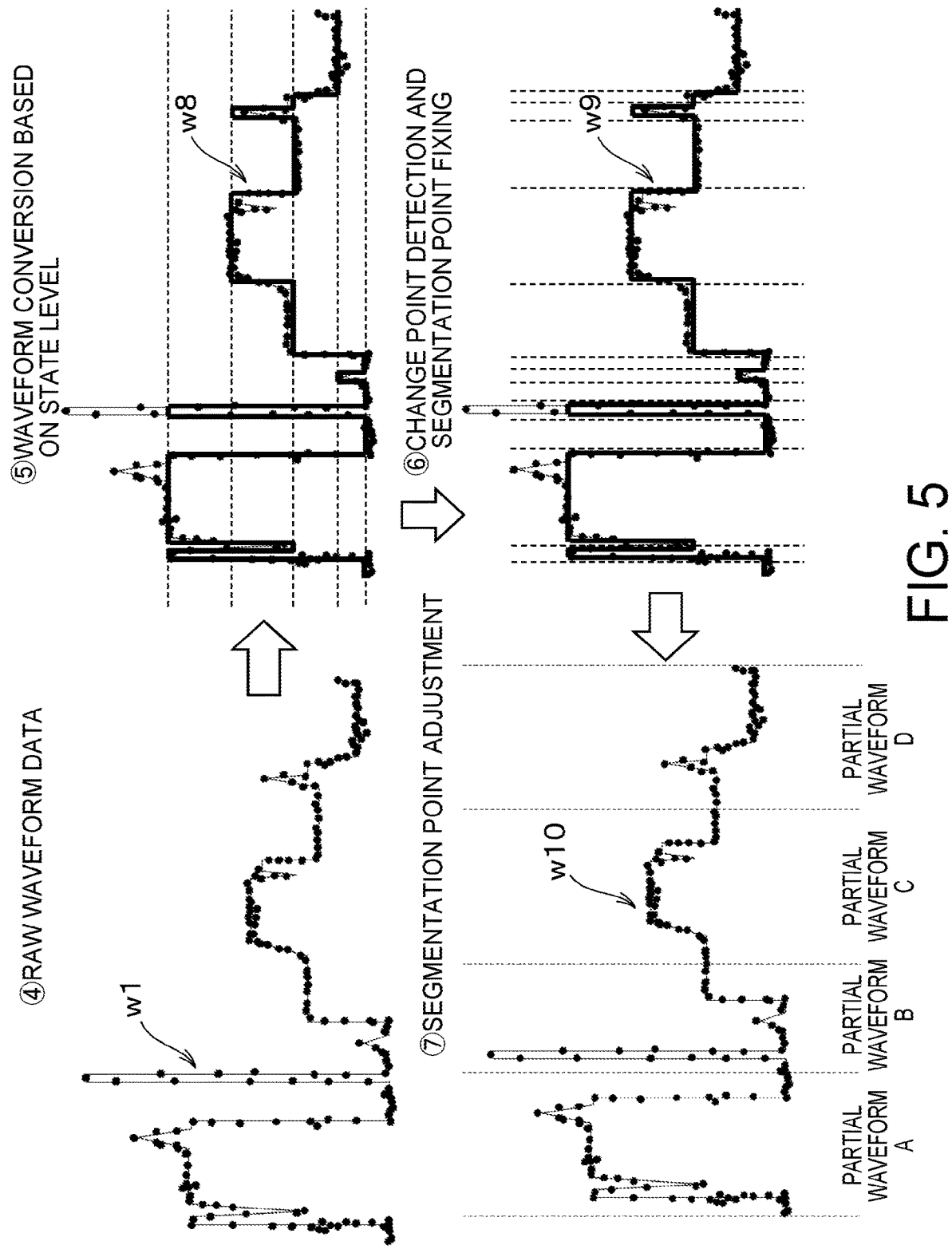
FIG. 5 is a view for describing a processing operation subsequent to FIG. 4.

FIGS. 3 to 5 are views illustrating the processing operation of the single waveform segmentation unit 11 in Steps S1 to S6 of FIG. 2. A waveform w1 in FIG. 3 is an example of waveform data input to the grouping unit 8. The state level estimation unit 2 estimates state levels of the waveform w1 as 155, 170, and 180. Next, segmentation is performed into partial waveform data A and B based on the estimated state levels. Next, state levels are estimated for each partial waveform data. As a result, as illustrated in a waveform w3, state levels 110, 162, and 180 are estimated in the partial waveform data A, and state levels 150, 158, and 170 are estimated in the partial waveform data B. Since the state levels 158 and 162 are close to each other, the waveform data conversion unit 5 assigns the state levels 158 and 162 to the same group, and sets a representative value of this group to 160. As a result, waveform data after having been subjected to waveform conversion is generated as illustrated in a waveform w4. Subsequently, the segmentation is performed based on the waveform data of the waveform w4.

FIG. 4 illustrates an example in which segmentation is performed on the waveform data w4. When the waveform data w4 is input to the grouping unit 8, the grouping unit 8 estimates a kernel density for the waveform data w4 and generates waveform data w5 as illustrated in a waveform w5. Waveform data w5 includes nine mountains and ten valleys. When the kernel density is divided at the valleys, nine data groups are obtained. The amounts of original waveform data included in the respective data groups are 20%, 15%, 8%, 7%, 47%, 0.75%, 0.75%, 0.75%, and 0.75%.

The state level estimation unit 2 discards mountain groups having low kernel density estimators, for example, mountains on the right side in FIG. 4. That is, spikes of waveform data are discarded. Thus, the data groups are sequentially selected from the highest mountain up to the desired number (for example, about 95%) in the entire waveform data. There is a possibility that a lot of small mountains appear in the case of an unstable waveform or an extremely fluctuating waveform, and thus, whether or not a data group includes data equal to or more than a threshold relative to the entire data (for example, 10% or more) is checked when selecting the data group.

If the data equal to or more than the threshold (for example, 10%) relative to the entire data is not included, the group is discarded. In this example, data groups of 47%, 20%, 15%, 8%, and 7% are sequentially selected. The grouping unit performs segmentation at valleys on both sides of each mountain, and sets pieces of original waveform data within the range to the same group. Next, outliers are excluded from each group.

Next, an average value or a median value of each data group is calculated, and the average value or the median value is set as a state level. In this example, values outside the range of the average value of entire waveform data±3× standard deviation have been processed as outliers. As a result, the state levels estimated in this example are 110, 150, 160, 170, and 180 as illustrated in the waveform w6 in FIG. 4.

Next, the waveform data conversion unit 5 converts the waveform data using the state levels as illustrated in a waveform w8 in FIG. 5. The state change point detection unit 6 detects a state conversion point of the converted waveform data. The segmentation identification unit 3 identifies a state change point as a segmentation candidate. A waveform w9 in FIG. 5 illustrates an example in which thirteen segmentation point candidates exist. Since there is a possibility that many small partial waveforms appear if a waveform is segmented with the segmentation point candidates, the first segmentation adjustment unit 9 first adjusts the segmentation points based on lengths of partial waveforms. If a length of a certain partial waveform is equal to or less than x % of the total waveform length, a segmentation point of that partial waveform is discarded from the segmentation point candidates. Next, the waveform is segmented by the remaining segmentation point candidates, and the state level is estimated for each partial waveform sequentially from the left based on kernel density estimation and clustering.

If a partial waveform does not have two state levels or the number of values belonging to a certain state level is less than y % of the number of values of the state levels of all the waveforms, the partial waveform is integrated with a left or right partial waveform. If a certain segment has two state levels in a certain segment but the last segment has only one state level, the segment and the last segment are integrated. As a result, five segmentation points for segmentation into four partial waveforms A to D are finally obtained as illustrated in a waveform w10.

Figure 6:
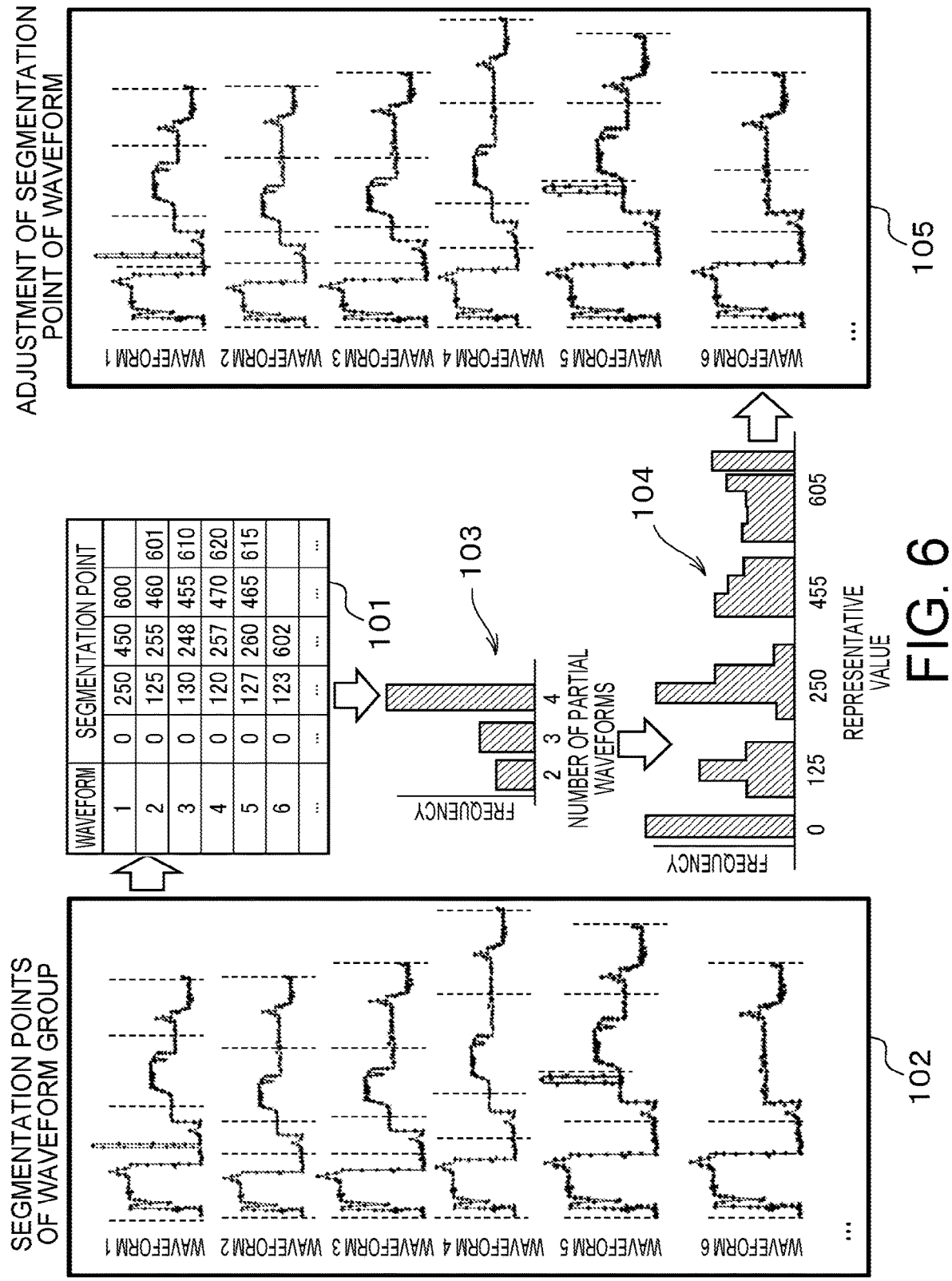
FIG. 6 is a view schematically illustrating a processing operation of a waveform group segmentation unit in Steps S7 to S11 in FIG. 2.

FIG. 6 is a view schematically illustrating a processing operation of the waveform group segmentation unit 12 in Steps S7 to S11 in FIG. 2. First, segmentation data of a plurality of pieces of waveform data included in the waveform group set in the processing of the single waveform segmentation unit 11 of S1 to S6 in FIG. 2 is obtained. The segmentation data is the number of partial waveforms of each waveform data, positions of the respective segmentation points and the like, and Table 101 in FIG. 6, for example, is obtained.

The number-of-partial-waveform calculation unit 13 detects a frequency of the number of partial waveforms of each waveform data based on segmentation points of each waveform data belonging to a waveform group 102 obtained by the processing of the single waveform segmentation unit 11 of S1 to S6 in FIG. 2. The frequency of the number of partial waveforms is represented by a histogram 103, for example. Since the frequency when the number of partial waveforms is four is the highest in the example of FIG. 6, five segmentation points are provided by setting the number of partial waveforms to four.

Next, each waveform data belonging to the waveform group is divided into five clusters (partial waveforms), and representative values of the respective cluster are determined. In the example of FIG. 6, the representative values of the respective clusters are 0, 125, 250, 455, and 605 as illustrated in a histogram 104.

Next, the second segmentation adjustment unit 15 adjusts the segmentation points of each waveform data using the representative values of the clusters. In the example of FIG. 6, as illustrated in a waveform group 105, a segmentation point is added to some waveform data such that the number of partial waveforms of the entire waveform data belonging to the waveform group 105 becomes four.

The waveform segmentation device 1 of FIG. 1 may include a display control unit 19 that displays a GUI screen 17 on the display unit 18. A user can confirm and adjust a segmentation result of a waveform group based on the GUI screen 17 of FIG. 7. Further, on the GUI screen 17 of FIG. 7, a plurality of partial waveforms obtained by segmenting single waveform data at a plurality of segmentation points can be visualized, and whether or not each partial waveform includes one or more feature values can be visually confirmed. The user can give a selection instruction by clicking an arbitrary button in the GUI screen 17 with a mouse or the like. Note that the GUI screen in FIG. 7 is an example, and a specific configuration of the GUI screen is arbitrary.

When the user determines that the segmentation of the waveform data is not performed correctly as a result of confirming the partial waveform on the GUI screen 17, an instruction to redo segmentation for each partial waveform or an instruction to redo segmentation of the entire waveform data based on state levels of the partial waveforms can be made. Further, an instruction can be made such that the segmentation point of each waveform data included in the waveform group coincides with a representative segmentation point. An instruction to extract the feature value of the waveform data on the GUI screen 17 of FIG. 7 can be made. As a result, it is possible to easily generate teacher data for learning when constructing an abnormality detection model as will be described later.

Figure 7:
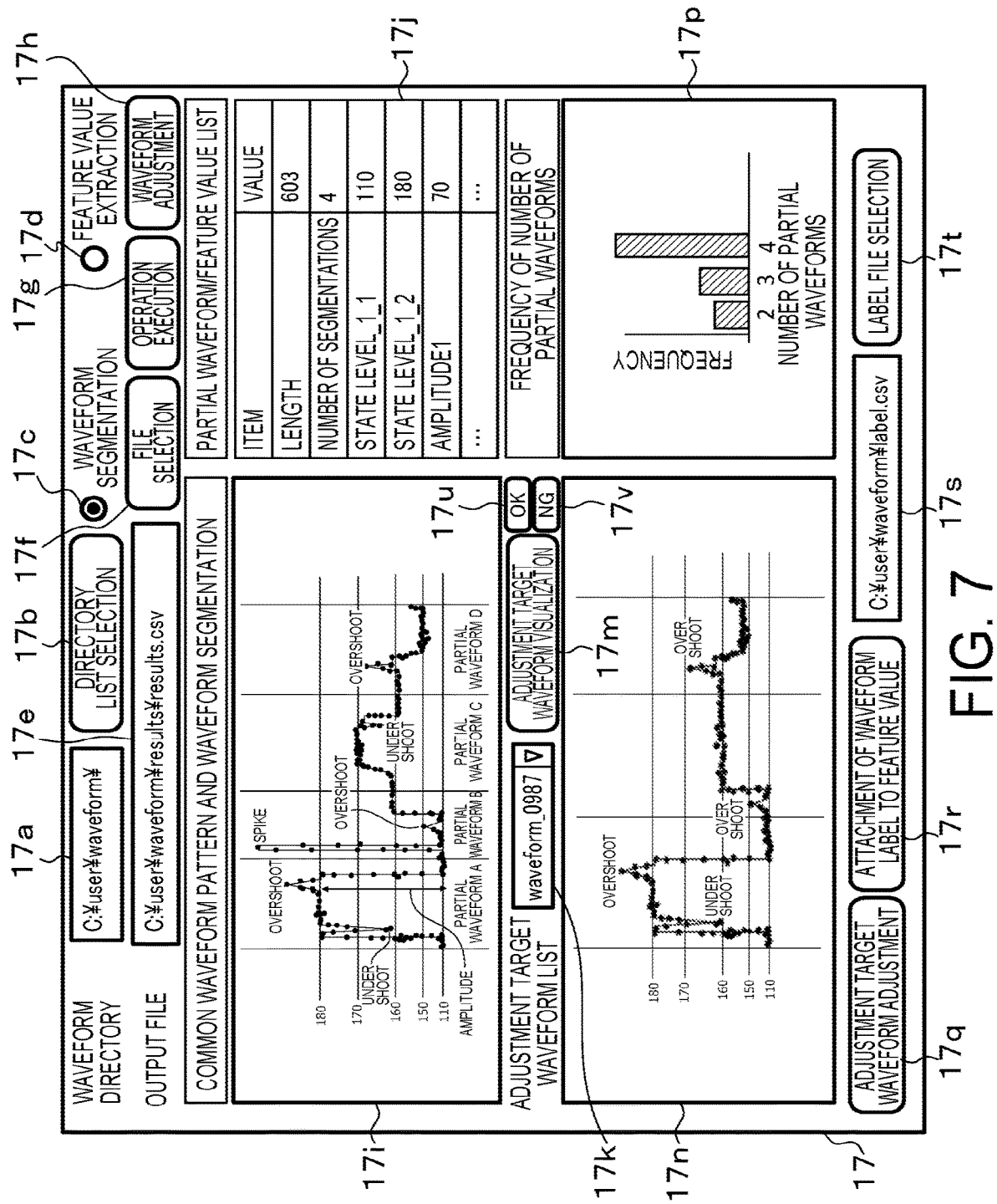
FIG. 7 is a view illustrating an example of a GUI screen.

The GUI screen 17 of FIG. 7 may include a waveform directory input area 17a to designate a location where waveform data is stored, a directory selection button 17b, a radio button 17c to select execution of waveform segmentation, and a radio button 17d to select execution of feature value extraction. Further, the GUI screen 17 of FIG. 7 may include an area 17e to input an output file name of waveform data, a file selection button 17f, an operation execution button 17g, and a waveform adjustment button 17h.

Further, the GUI screen 17 of FIG. 7 may include an area 17i to display representative waveform data and a representative segmentation position and an area 17j to display a partial waveform and a feature value list. Further, the GUI screen 17 of FIG. 7 may include an area 17k to select an adjustment target waveform list, which is a segmentation target, an adjustment target waveform visualization button 17m, an area 17n to display adjustment target waveform data and a segmentation position thereof, and an area 17p to display frequency information of the number of partial waveforms of each waveform data in a waveform group. Further, the GUI screen 17 of FIG. 7 may include a button 17q to instruct adjustment of segmentation of an adjustment target waveform, a button 17r to instruct attachment of a waveform label to a feature value, an area 17s to input a file name of a waveform label, and a label file selection button 17t.

For example, when the radio button 17c for selection of the execution of waveform segmentation is selected and the operation execution button 17g is clicked on the GUI screen 17 of FIG. 7, the segmentation of one or more waveforms is performed. A segmentation result of representative waveform data is displayed in the area 17i, and a segmentation result of adjustment target waveform data is displayed in the area 17n.

When the case where the number of partial waveforms is four has a highest frequency in a waveform group, waveform data having four partial waveforms is displayed in the area 17i as the representative waveform data. The adjustment target waveform list 17k holds a list of waveform data with the number of partial waveforms being different from the highest frequency. When one waveform ID is selected from the adjustment target waveform list 17k and the adjustment target waveform visualization button 17m is clicked, the segmentation result of the adjustment target waveform data is displayed in the area 17n.

It is possible to easily determine whether or not the segmentation of the adjustment target waveform data needs to be adjusted by comparing the segmentation results of the representative waveform data and the adjustment target waveform data on the GUI screen 17 of FIG. 7. When it is determined that the segmentation of the adjustment target waveform data needs to be adjusted, the segmentation of the adjustment target waveform data is automatically performed with the number of partial waveforms having the highest frequency by clicking the adjustment target waveform adjustment button 17h.

Information on the segmentation of representative waveform data is posted in the partial waveform/feature value list 17j. An example in which the partial waveform/feature value list 17j includes a time length of the representative waveform data, the number of segmentation points, a state level of first representative partial waveform data, a state level of second representative partial waveform data, an amplitude of the first representative partial waveform data, and the like is illustrated in the example of FIG. 7.

When a state level is not correctly estimated, the state level estimation and the waveform segmentation are performed again for each partial waveform by clicking the waveform adjustment button 17h. If state levels and segmentation points estimated in the original segment are different from newly estimated state levels and segmentation points, the state levels and segmentation points are adjusted.

When the waveform segmentation has been performed correctly, it is also possible to extract a waveform feature value and attach a label to the feature value. That is, it is possible to generate teacher data of the waveform feature value and the waveform label in order to construct an abnormality detection model. In this case, first, a label file is selected by clicking the label file selection button 17t. Next, when the button 17r to attach a waveform label to a feature value is clicked, the label is attached to the waveform feature value, and the waveform feature value is written in the input area 17s of a file designated as an output file.

The GUI screen 17 in FIG. 7 may include buttons 17u and 17v to input a result of user's visually confirmation on whether or not the segmentation of the adjustment target waveform data is appropriate. When the user clicks the button 17u, it is determined that the segmentation of the adjustment target waveform data is appropriate, and such information may be stored in waveform data DB 7. When the user clicks the button 17v, it is determined that the segmentation of the adjustment target waveform data is inappropriate, and the segmentation of the adjustment target waveform data may be redone similarly to the case where the waveform adjustment button 17h is clicked.

In this manner, the state level of the input waveform data is estimated, and the waveform data is segmented at the plurality of segmentation points based on the estimated state level in the first embodiment. For example, when the segmentation is performed such that the feature value is always included in the partial waveform data between two adjacent segmentation points, the feature value can be easily extracted.

According to the present embodiment, the waveform data whose waveform shape, such as the sensor detection data, changes in a complicated manner is automatically segmented at the segmentation point, and thus, feature points of the plurality of pieces of waveform data can be easily compared with each other, and abnormality detection and the like can be accurately performed at high speed.

In the present embodiment, the state level can be re-estimated to adjust the position of the segmentation point after setting the segmentation point once, and the extraction accuracy of the feature point can be improved.

Since the number and positions of segmentation points between pieces of waveform data are aligned to compare the pieces of partial waveform data for the waveform group including the plurality of pieces of waveform data after the segmentation of each waveform data is completed in the present embodiment, it is possible to accurately determine whether or not the feature points coincide between the respective pieces of waveform data included in the waveform group.

Since the GUI screen 17 is provided such that the user can visually compare the segmentation of the representative waveform with the segmentation of the adjustment target waveform in the present embodiment, it is possible to visually confirm whether the segmentation of the adjustment target waveform has been performed correctly, and it is possible to instruct the segmentation adjustment if the adjustment target waveform has not been correctly performed.

Second Embodiment

Although the waveform segmentation device 1 according to the second embodiment has the same block configuration as that in FIG. 1, a processing operation of the second segmentation adjustment unit 15 is different from that of the first embodiment.

The number-of-partial-waveform calculation unit 13 calculates the number of partial waveforms (for example, n) similarly to that of the first embodiment. The segmentation determination unit 14 determines segmentation points, extracts a waveform group having n partial waveforms, and generates a representative partial waveform of each partial waveform using the extracted waveform group. Thus, the segmentation determination unit 14 can select the longest or shortest partial waveform among all the partial waveforms between two segmentation points in the waveform group as a representative waveform. Alternatively, a representative partial waveform can be generated by adjusting lengths of other partial waveforms by linear interpolation or a dynamic time warping (DTW) technique using the longest or shortest partial waveform and averaging the respective points of the partial waveform. Furthermore, the segmentation determination unit 14 may generate a representative partial waveform by a dynamic time warping barycenter averaging (DBA) technique for all partial waveforms between two segmentation points.

The second segmentation adjustment unit 15 adjusts segmentation points of an adjustment target waveform group using the representative partial waveform generated by the segmentation determination unit 14. Therefore, first, pattern matching is performed between a partial waveform of each adjustment target waveform and the representative partial waveform. Specifically, the pattern matching is performed between one or more partial waveforms of an adjustment target waveform and one or more partial waveforms of the representative waveform within the range of the number of partial waveforms of the adjustment target waveform and the number of representative partial waveforms. Here, one example will be described.

It is assumed that the partial waveforms of the adjustment target waveform are Se={Se1, Se2, Se3}, and the representative partial waveform is Sr={Sr1, Sr2, Sr3, Sr4}. Since the number of partial waveforms of the adjustment target partial waveform Se is smaller than the representative partial waveform Sr, mapping is performed between the adjustment target partial waveform Se and the representative partial waveform Sr. First, the number kmax of partial waveforms to be compared with the representative partial waveform Sr is determined. In this case, kmax=4. Therefore, partial waveform groups of the representative partial waveform Sr are {Sr1}, {Sr2}, {Sr3}, {Sr4}, {Sr1+Sr2}, {Sr2+Sr3}, {Sr3+Sr4}, {Sr1+Sr2+Sr3}, {Sr2+Sr3+Sr4}, and {Sr1+Sr2+Sr3+Sr4}.

First, the adjustment target partial waveform Se1 is compared with each representative partial waveform of a representative partial waveform group, and a representative partial waveform that is most similar is selected. For example, when the adjustment target partial waveform Se1 is extremely similar to the representative partial waveform Sr1, the adjustment target partial waveform Se1 is mapped to the representative partial waveform Sr1.

Next, since the adjustment target partial waveform Se1 and the representative partial waveform Sr1 are mapped, representative partial waveform groups of the representative partial waveform Sr with respect to the adjustment target partial waveform Se2 is {Sr2}, {Sr3}, {Sr4}, {Sr2+Sr3}, {Sr3+Sr4}, and {Sr2+Sr3+Sr4}, and the most similar partial waveform is selected. For example, the adjustment target partial waveform Se2 is mapped as being similar to {Sr2+Sr3}. That is, the adjustment target partial waveform Se2 is mapped as being similar to the two partial waveforms {Sr2+Sr3} of the representative partial waveform.

Next, the representative partial waveform group {Sr4} of the representative partial waveform Sr is associated with the adjustment target partial waveform Se3, and the adjustment target partial waveform Se3 and the representative partial waveform Sr4 are mapped.

Since the adjustment target partial waveform Se2 is similar to the representative partial waveform group {Sr2+Sr3} as described above, the adjustment target partial waveform Se2 is segmented using the representative partial waveforms Sr2 and Sr3. The representative partial waveform Sr2 and the representative partial waveform Sr3 are sequentially matched from the left side of the adjustment target partial waveform Se2 and from the right side of the adjustment target partial waveform Se2, respectively.

A cumulative similarity is calculated at each point of the adjustment target partial waveform Se2. The segmentation is performed at a point before a point where the cumulative similarity with the representative partial waveform Sr2 becomes larger than the cumulative similarity with the representative partial waveform Sr3. Here, one example will be described.

It is assumed that there are ten points {p1, p2, p3, p4, p5, p6, p7, p8, p9, p10} in the adjustment target partial waveform Se. It is assumed that the cumulative similarity with the representative partial waveform Sr2 is 1, 1, 2, 2, 3, 8, 14, 15, 18, and 19, and the cumulative similarity with the representative partial waveform Sr3 is 25, 19, 15, 12, 10, 4, 2, 2, 1, and 1 at the respective points. Since the cumulative similarity=8 with the representative partial waveform Sr2 at p6 is larger than the cumulative similarity=4 with Sr3, it is determined that the segmentation is performed at p5. That is, the mapping is performed as follows.

Se1→Sr1, Se2 (p1 to p5)→Sr2, Se2 (p6 to p10)→Sr3, and Se3→Sr4.

Figure 8B:
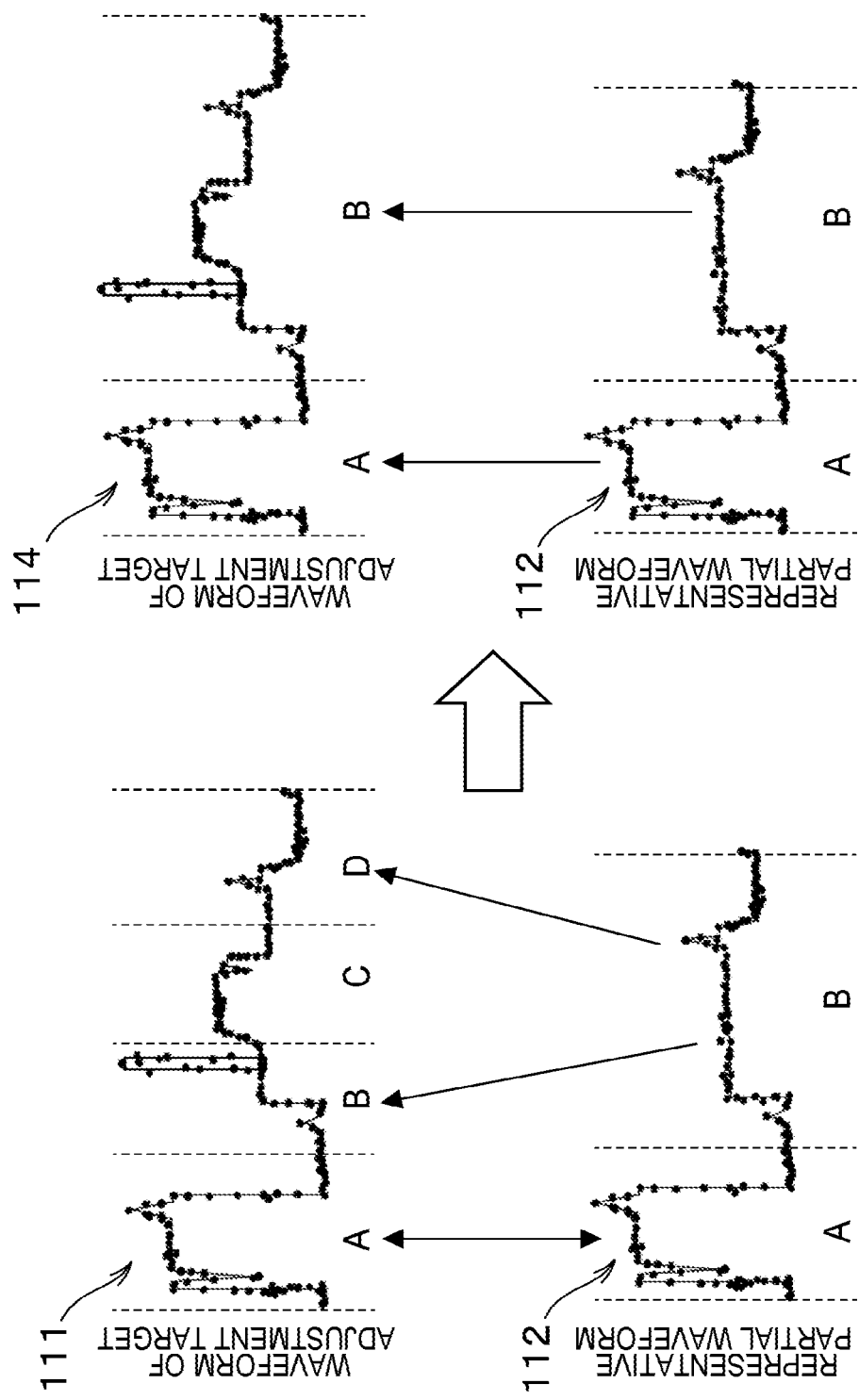
FIG. 8B is a view illustrating a processing operation of the second segmentation adjustment unit according to the second embodiment.

FIGS. 8A and 8B are views for describing a processing operation of the second segmentation adjustment unit 15 according to the second embodiment.

FIG. 8A illustrates an example in which a representative waveform 111 is segmented into representative partial waveforms A to D, and an adjustment target waveform 112 is segmented into partial waveforms A and B. In this case, the second segmentation adjustment unit 15 determines that the partial waveform A of the adjustment target waveform 112 is similar to the representative partial waveform A, the partial waveform B of the adjustment target waveform 112 is similar to the representative partial waveforms B and D, respectively, and the adjustment target waveform 112 does not include the representative partial waveform C.

Therefore, the second segmentation adjustment unit 15 adds a partial waveform C' having zero amplitude between the partial waveforms B and D of the adjustment target waveform 112 as illustrated in the adjustment target waveform 113 in FIG. 8A. This partial waveform C' indicates that data is abnormal data without the representative partial waveform C.

On the other hand, FIG. 8B illustrates an example in which a representative waveform is divided into representative partial waveforms A and B, and an adjustment target waveform is divided into partial waveforms A to D as illustrated in the adjustment target waveform 111. In this case, as illustrated in a waveform group 114, the second segmentation adjustment unit 15 determines that the partial waveform B of the adjustment target waveform is partially similar to the representative partial waveforms B and D, and integrate the representative partial waveforms B to D into the representative partial waveform B.

In this manner, in the second embodiment, regarding the adjustment target waveform having the number of partial waveforms different from that of the representative waveform, the similarly is calculated by matching each representative partial waveform included in the representative waveform with each partial waveform included in the adjustment target waveform, and the segmentation of the adjustment target waveform is adjusted based on a cumulative result of the similarity. As a result, it is possible to accurately detect whether or not a feature value included in the representative waveform is also included in the adjustment target waveform. Therefore, even when the adjustment target waveform fluctuates in a complicated manner, the feature value of the adjustment target waveform can be accurately and quickly extracted.

Third Embodiment

Figure 9:
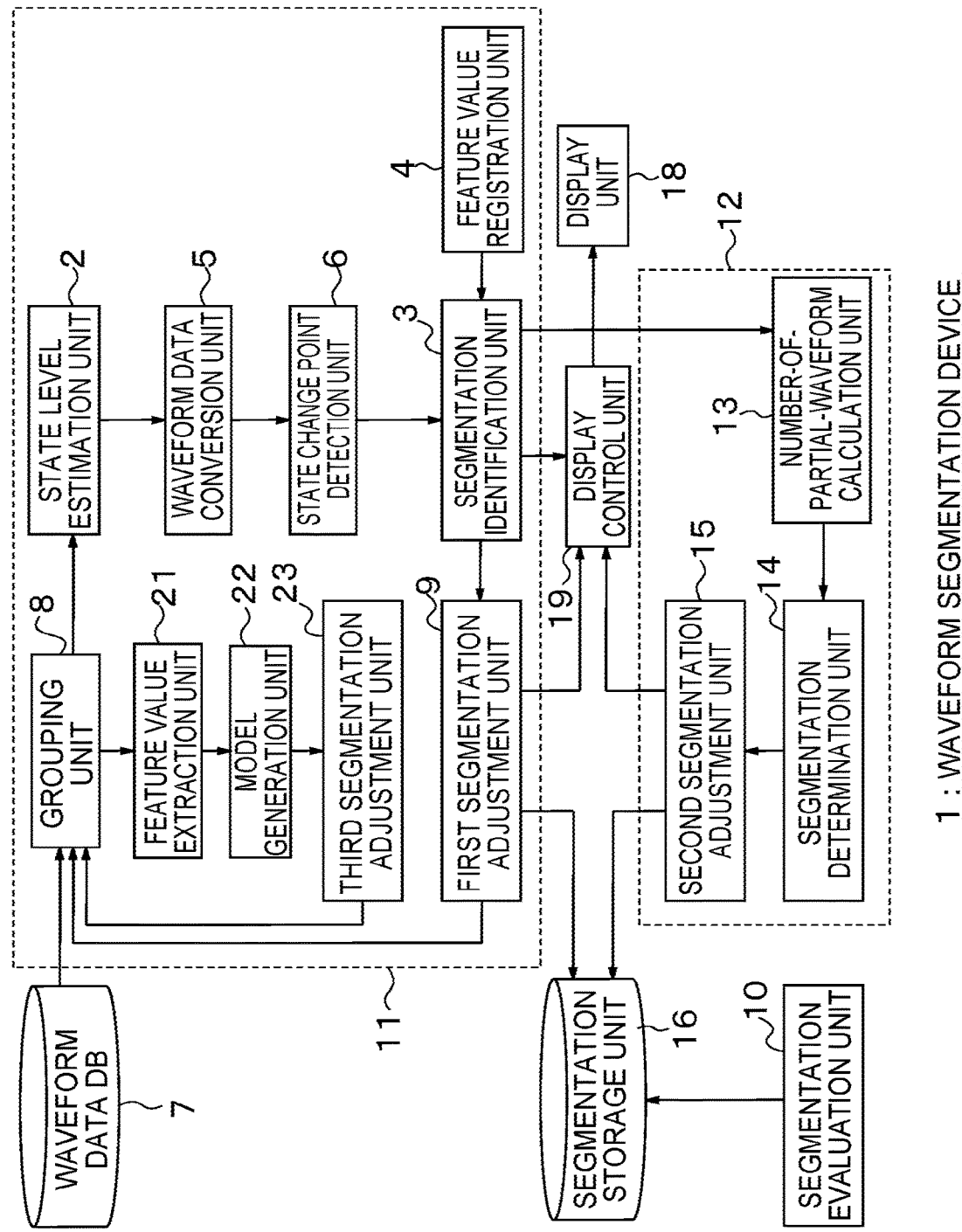
FIG. 9 is a block diagram illustrating a schematic configuration of a waveform segmentation device 1 according to a third embodiment.

FIG. 9 is a block diagram illustrating a schematic configuration of a waveform segmentation device 1 according to a third embodiment. The waveform segmentation device 1 of FIG. 9 includes a feature value extraction unit 21, a model generation unit 22, and a third segmentation adjustment unit 23 in addition to the configuration of FIG. 1.

The feature value extraction unit 21 extracts a feature value of input waveform data. The model generation unit 22 generates an abnormality detection model that outputs a numerical value of a possibility that the input waveform data is abnormal, based on the feature value extracted by the feature value extraction unit 21. In the present specification, an output value of the abnormality detection model is also referred to as classification accuracy. Although there is no limitation on a specific type of the abnormality detection model to be generated, examples thereof include models such as a support vector machine (SVM), which is a machine learning classifier, a logistic regression, and a k-nearest neighbor.

When positions of a plurality of segmentation points for segmentation of the input waveform data are changed in a plurality of ways, the third segmentation adjustment unit 23 adjusts the plurality of segmentation positions based on each of output values of the abnormality detection model.

Figure 10:
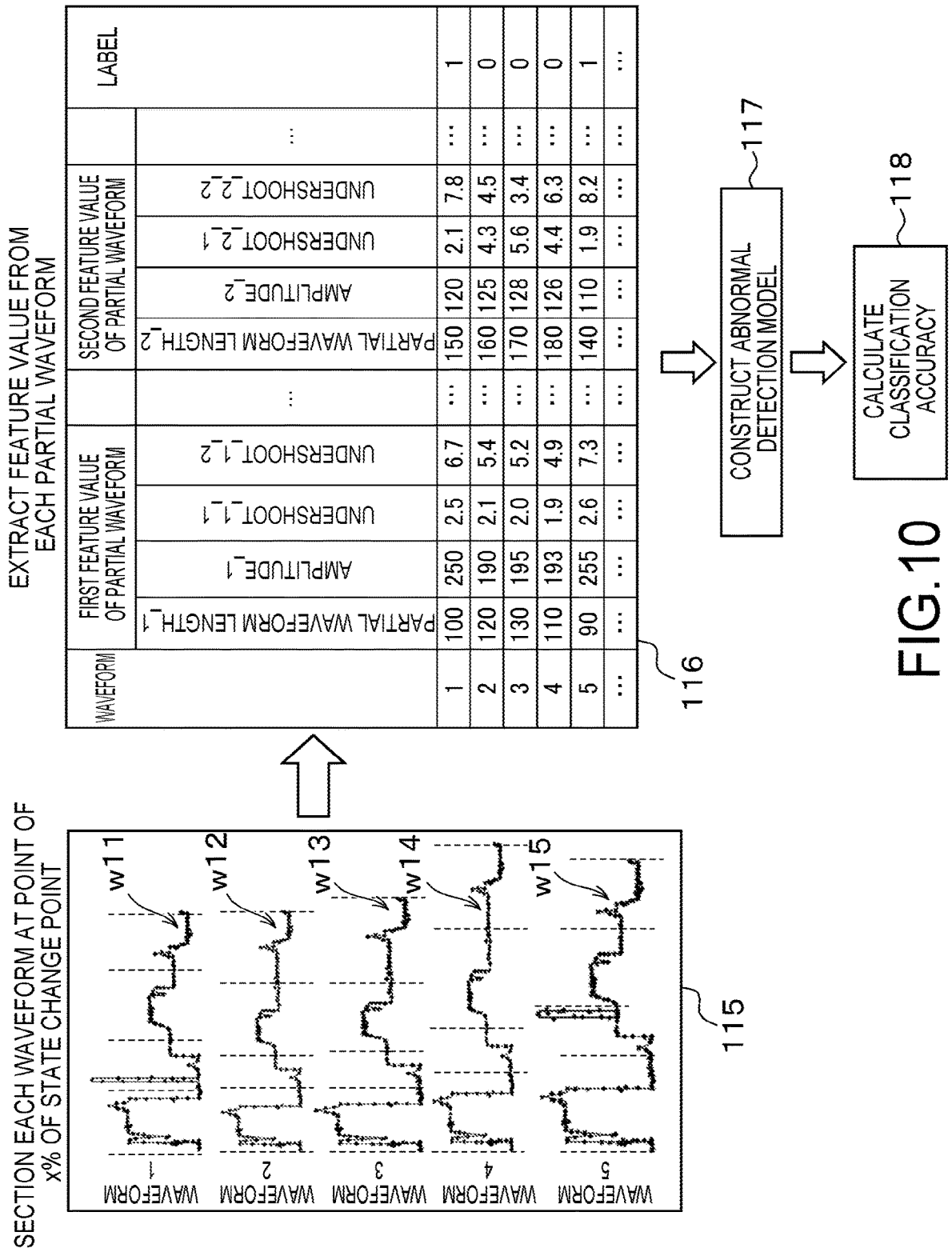
FIG. 10 is a view illustrating an example in which a waveform group having a plurality of pieces of waveform data is input.

FIG. 10 illustrates an example in which a waveform group 115 having a plurality of pieces of waveform data w11 to w15 is input. The feature value extraction unit 21 extracts a feature value of the waveform group 115 and generates, for example, a list 116 as illustrated in FIG. 10. The list 116 includes, for example, information such as a length, an amplitude, and a magnitude of undershoot of each partial waveform included in each waveform data.

After the model generation unit 22 generates the abnormality detection model (reference sign 117), the third segmentation adjustment unit 23 acquires each output, that is, the classification accuracy of the abnormality detection model at segmentation positions of each waveform data, that is, when a state change point is shifted from 10% to 100% in units of 10% (reference sign 118). The third segmentation adjustment unit 23 adjusts the segmentation point based on the segmentation position when the output (classification accuracy) of the abnormality detection model is the highest, that is, when it is determined that the abnormality detection model is most likely to be normal.

FIG. 11 is a view illustrating an example of the output value of the abnormality detection model when the segmentation point is shifted in units of 10%. In the example of FIG. 11, the output value of the abnormality detection model is the highest when the segmentation point is shifted by 50%. Therefore, the third segmentation adjustment unit 23 performs the adjustment so as to shift the segmentation point by 50%.

When there are many small state changes between two state change points, the best segmentation point may be selected using a combinatorial optimization technique such as a genetic algorithm.

In this manner, since the output values of the abnormality detection model are confirmed while shifting the position of the segmentation point of the waveform data and the segmentation position determined to be most likely to be normal in the abnormality detection model is finally selected in the third embodiment, the segmentation position can be optimized by a simple processing procedure.

At least some components of the waveform segmentation device 1 according to the above-described first to third embodiments may be configured as a chip. For example, at least some components of the waveform segmentation device 1 according to the first to third embodiments may be incorporated in a system on chip (SoC) such as an edge device. In this case, the waveform data DB 7 and the segmentation storage unit 16 may be provided outside the SoC so as to be accessible via a predetermined interface device. Since the edge device performs communication between a plurality of networks, it is possible to quickly and accurately extract feature values of waveform data output from various sensors and easily share the extracted feature values among the plurality of networks.

At least a part of the waveform segmentation device 1 described in the above embodiments may be configured by hardware or software. When configured by the software, a program to implement at least some functions of the waveform segmentation device 1 may be stored in a storage medium, such as a flexible disk and a CD-ROM, and then may be read and executed by a computer. The recording medium is not limited to a detachable storage medium, such as a magnetic disk and an optical disc, and may be a fixed recording medium, such as a hard disk and a memory.

Further, the program to implement at least some functions of the waveform segmentation device 1 may be distributed through a communication line (including radio communication) such as the Internet. Further, the program that has been encrypted, modulated, or compressed, may be distributed through a wired line or a wireless line, such as the Internet, or may be stored in a recording medium and then may be distributed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A waveform segmentation device comprising:
  a sensor installed at a factory or a plant; and
  processing circuitry configured to:
    receive waveform data from the sensor, the waveform data representing sensor detection data;
    estimate a state level of the waveform data;
    identify a plurality of segmentation points and segment the waveform data at a plurality of segmentation points based on the estimated state level;
    estimate state levels of a plurality of pieces of partial waveform data based on the plurality of pieces of partial waveform data obtained by segmenting the waveform data at the plurality of segmentation points;
    update the estimated state level based on the estimated state levels;
    adjust positions of the plurality of segmentation points for segmenting the input waveform data based on a plurality of representative segmentation points for segmenting representative waveform data selected from among a plurality of pieces of waveform data belonging to a waveform group;
    calculate a number of partial waveforms required to segment each waveform data included in the waveform group by calculating a frequency of the number of partial waveforms in the waveform group, and determining the number of partial waveforms having a highest frequency as the number of partial waveforms required to segment each waveform data included in the waveform group;

extract a waveform feature value from between two adjacent segmentation points among the segmentation points;

generate an abnormality detection model based on the waveform feature value;

perform abnormality detection on the sensor detection data using the abnormality detection model; and transmit the waveform feature value to a plurality of networks.

2. The waveform segmentation device according to claim 1, wherein the plurality of segmentation points are identified such that the waveform feature value of the waveform data is included between two adjacent segmentation points among the segmentation points.

3. The waveform segmentation device according to claim 1, wherein the processing circuitry is further configured to group the waveform data into a plurality of groups based on a value of the input waveform data, wherein the state level is estimated based on a representative value of each group after integrating or dividing some groups among the plurality of groups.

4. The waveform segmentation device according to claim 3, wherein the waveform data is grouped into the plurality of groups based on a value and a frequency of the waveform data.

5. The waveform segmentation device according to claim 1, wherein the processing circuitry is further configured to:

convert the waveform data based on the estimated state level; and detect a state change point at which the state level of the converted waveform data changes, wherein the plurality of segmentation points are identified based on the state change point.

6. The waveform segmentation device according to claim 1, wherein the processing circuitry is further configured to determine the representative waveform data and the plurality of representative segmentation points based on the plurality of segmentation points for each of a plurality of pieces of input waveform data, wherein the plurality of segmentation points are adjusted for each of the plurality of pieces of input waveform data based on the determined plurality of representative segmentation points.

7. The waveform segmentation device according to claim 6, wherein the plurality of segmentation points are adjusted by pattern-matching a plurality of pieces of representative partial waveform data obtained by segmenting the representative waveform data at the plurality of representative segmentation points with a plurality of pieces of partial waveform data obtained by segmenting each of the plurality of pieces of input waveform data at the plurality of segmentation points.

8. The waveform segmentation device according to claim 6, wherein the representative waveform data and the plurality of representative segmentation points are determined after performing a process of aligning time lengths of the plurality of pieces of waveform data when at least one of the plurality of pieces of input waveform data has a different waveform length from another waveform data.

9. The waveform segmentation device according to claim 6, wherein a segmentation point is deleted at a first position from the plurality of representative segmentation points while leaving a segmentation point at a second position that is closer to the plurality of representative segmentation points among the plurality of segmentation points for each of the plurality of pieces of input waveform data, wherein the first position is further from the plurality of representative segmentation points than the second position.

10. The waveform segmentation device according to claim 6, wherein the processing circuitry is further configured to visualize the representative waveform data, the plurality of representative segmentation points, the input waveform data, and the plurality of segmentation points.

11. The waveform segmentation device according to claim 10, wherein the processing circuitry is further configured to evaluate the visualized plurality segmentation points.

12. The waveform segmentation device according to claim 1, wherein the processing circuitry is further configured to:

generate the abnormality detection model to output a value indicating a possibility that the input waveform data is abnormal; and adjust positions of the plurality of segmentation points based on the value output by the abnormality detection model when positions of the plurality of segmentation points for segmenting the input waveform data are changed in a plurality of ways.

13. The waveform segmentation device according to claim 1, wherein the processing circuitry is further configured to input waveform data in chronological order, wherein the state level of the input waveform data is estimated.

14. A waveform segmentation device comprising:

a sensor installed at a factory or a plant; and processing circuitry configured to:

receive waveform data from the sensor, the waveform data representing sensor detection data;

estimate a state level of the waveform data;

identify a plurality of segmentation points and segment the waveform data at a plurality of segmentation points based on the estimated state level;

estimate state levels of a plurality of pieces of partial waveform data based on the plurality of pieces of partial waveform data obtained by segmenting the waveform data at the plurality of segmentation points;

update the estimated state level based on the estimated state levels;

adjust positions of the plurality of segmentation points for segmenting the input waveform data based on a plurality of representative segmentation points for segmenting representative waveform data selected from among a plurality of pieces of waveform data belonging to a waveform group;

evaluate the identified plurality of segmentation points or the adjusted plurality of segmentation points;

calculate a number of partial waveforms required to segment each waveform data included in the waveform group by calculating a frequency of the number of partial waveforms in the waveform group, and determining the number of partial waveforms having a highest frequency as the number of partial waveforms required to segment each waveform data included in the waveform group;

extract a waveform feature value from between two adjacent segmentation points among the segmentation points;

generate an abnormality detection model based on the waveform feature value;

perform abnormality detection on the sensor detection data using the abnormality detection model; and transmit the waveform feature value to a plurality of networks.

15. A waveform segmentation method comprising:

receiving, from a sensor installed at a factory or a plant, waveform data from the sensor, the waveform data representing sensor detection data;

estimating a state level of the waveform data;

segmenting the waveform data at a plurality of segmentation points based on the estimated state level;

estimating state levels of a plurality of pieces of partial waveform data based on the plurality of pieces of partial waveform data obtained by segmenting the waveform data at the plurality of segmentation points;

updating the estimated state level based on the estimated state levels;

adjusting positions of the plurality of segmentation points for segmenting the input waveform data based on a plurality of representative segmentation points for segmenting representative waveform data selected from among a plurality of pieces of waveform data belonging to a waveform group;

calculating a number of partial waveforms required to segment each waveform data included in the waveform group by calculating a frequency of the number of partial waveforms in the waveform group, and determining the number of partial waveforms having a highest frequency as the number of partial waveforms required to segment each waveform data included in the waveform group;

extracting a waveform feature value from between two adjacent segmentation points among the segmentation points;

generating an abnormality detection model based on the waveform feature value;

performing abnormality detection on the sensor detection data using the abnormality detection model; and transmitting the waveform feature value to a plurality of networks.

16. The waveform segmentation method according to claim 15, wherein the segmenting identifies the plurality of segmentation points such that the waveform feature value of the waveform data is included between two adjacent segmentation points among the segmentation points.

17. The waveform segmentation method according to claim 15, further comprising grouping the waveform data into a plurality of groups based on a value of the input waveform data, wherein the estimating comprises estimating the state level based on a representative value of each group after integrating or dividing some groups among the plurality of groups.

18. The waveform segmentation method according to claim 17, wherein the waveform data is grouped into the plurality of groups based on a value and a frequency of the waveform data.

* * * * *